(12) United States Patent
Park

(10) Patent No.: US 7,733,206 B2
(45) Date of Patent: Jun. 8, 2010

(54) SPIRAL INDUCTOR HAVING VARIABLE INDUCTANCE

(75) Inventor: Book Sung Park, Seoul (KR)

(73) Assignee: Pantech & Curitel Communications, Inc., Seoul (KR)

( * ) Notice: Subject to any disclaimer, the term of this patent is extended or adjusted under 35 U.S.C. 154(b) by 0 days.

(21) Appl. No.: 11/582,104

(22) Filed: Oct. 17, 2006

(65) Prior Publication Data

US 2007/0085649 A1   Apr. 19, 2007

(30) Foreign Application Priority Data

Oct. 17, 2005   (KR) ...................... 10-2005-0097446

(51) Int. Cl.
*H01F 5/00* (2006.01)
(52) U.S. Cl. .................................... 336/200
(58) Field of Classification Search .................. 336/200
See application file for complete search history.

(56) References Cited

U.S. PATENT DOCUMENTS

| | | | | |
|---|---|---|---|---|
| 5,629,553 A | * | 5/1997 | Ikeda et al. ................. 257/531 |
| 6,992,366 B2 | * | 1/2006 | Kim et al. .................... 257/531 |
| 7,202,768 B1 | * | 4/2007 | Harvey et al. ............... 336/232 |
| 2005/0068146 A1 | * | 3/2005 | Jessie ......................... 336/200 |

* cited by examiner

*Primary Examiner*—Elvin G Enad
*Assistant Examiner*—Joselito Baisa
(74) *Attorney, Agent, or Firm*—H.C. Park & Associates, PLC

(57) ABSTRACT

Disclosed is a spiral inductor formed on a semiconductor substrate. The spiral inductor comprises: a metal line forming a spiral pattern on a substrate using conductors having different widths and having open or short-type stubs at one side of each of the conductors; and switching means connection-controlled in accordance with a selection signal for adjusting an inductance and selectively connecting the conductors of the different widths of the metal line. According to the invention, the open or short-type stubs may be formed at one sides of each of the conductors, thereby inducing a parasitic capacitance or parasitic inductance. Based on the inducement of the parasitic capacitance or inductance and selectively connection of the conductors to one another through switching means, it is possible to accurately control a whole inductance value of the spiral inductor, depending on use purposes.

10 Claims, 6 Drawing Sheets

A and B can be varied in accordance with each frequency and impedance.

(a)　　　　　(b)

SPIRAL INDUCTOR HAVING VARIABLE INDUCTANCE

CROSS-REFERENCE TO RELATED APPLICATION

The present application is claiming priority of Korean Patent Application No. 10-2005-0097446, filed on Oct. 17, 2005, the content of which is herein incorporated by reference.

BACKGROUND OF THE INVENTION

1. Field of the Invention

The present invention relates to a spiral inductor, and more particularly, to a spiral inductor provided to an integrated circuit (IC) of a variety of communication devices using a high frequency band, wherein a metal line of the spiral conductor is embodied as conductors having different widths and open or short-type stubs are formed at one side of each of the conductors to induce parasitic capacitances or inductances. A whole inductance value of the spiral inductor can be controlled accurately depending on use purpose by selectively connecting conductors having different widths through switching means.

2. Description of the Prior Art

FIG. 1 is a perspective view showing an example of a conventional spiral inductor. As shown, the inductor comprises a first port 10, a second port 11 and a Via contact 12.

The first and second ports 10, 11 are terminals through which a signal is inputted and outputted and are arranged to be spaced perpendicularly to an insulating film, which is a silicone substrate, thereby forming a structure connected to each other by the via contact 12 passing through the insulating film. In the structure, the second port 11 is spirally turned toward a center thereof from an outer periphery.

In case of the spiral conductor as described above, since there is no mutual inductance between the first and second ports 10, 11, it is required to change number, shape and size of the second port 11, thereby varying turns of the spiral, an inner diameter, a width of the metal line, a distance between the metal lines and the like, so as to increase a whole inductance.

However, in this case, the whole inductance is also increased, thereby decreasing a degree of integration in an entire circuit. In addition, when an area of the inductor is increased to a predetermined size or more, a parasitic capacitance, which occurs between the respective ports 10, 11 and the substrate, is also increased, so that a quality factor (Q-factor) of the inductor is rapidly decreased and the whole inductance is not increased any more.

Further, the maximum Q-factor of the inductor is generated in only a specific frequency, so that it is impossible to generate the maximum Q-factor in a frequency band that a circuit designer desires.

SUMMARY OF THE INVENTION

Accordingly, the present invention has been made to solve the above problems. An object of the invention is to provide a spiral inductor provided to an integrated circuit (IC) of a variety of communication devices using a high frequency band, wherein a metal line of the spiral conductor is embodied as conductors having different widths and open or short-type stubs are formed at one side of each of the conductors to induce a parasitic capacitance or inductance. Based on the inducement of the parasitic capacitance or inductance and selectively connection of the conductors to one another through switching means, it is possible to accurately control a whole inductance value of the spiral inductor, depending on use purposes, or enable the inductor to have various inductances using a small area on the substrate, in a high frequency band.

In order to achieve the above object, there is provided a spiral inductor comprising: a metal line forming a spiral pattern on a substrate using conductors having different widths to one another and having an open or short-type stub at one side of each of the spiral patter formed; and switching means connection-controlled in accordance with a selection signal for adjusting an inductance and selectively connecting the conductors to one another.

According to another embodiment of the invention, there is provided a spiral inductor arranged to two or more layers on a semiconductor substrate constituting an integrated circuit, the spiral inductor comprising: a first layer having a port receiving a selection signal for adjusting an inductance outputted from a control section in the integrated circuit; a second layer having switching means connection-controlled by the selection signal inputted through the first layer; a third layer in which conductors having different widths to one another are formed into a spiral pattern on the substrate and open or short-type stubs are formed at one side of each of the conductors; and a fourth layer for applying ground power.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a preferred embodiment of the present invention will be described with reference to the accompanying drawings. In the following description of the present invention, a detailed description of known functions and configurations incorporated herein will be omitted when it may make the subject matter of the present invention rather unclear.

Figure 1:
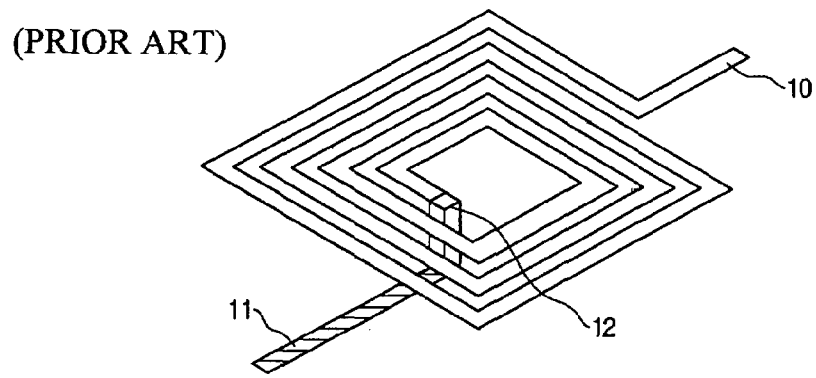
FIG. 1 is a perspective view showing an example of a conventional spiral inductor.
Figure 2:
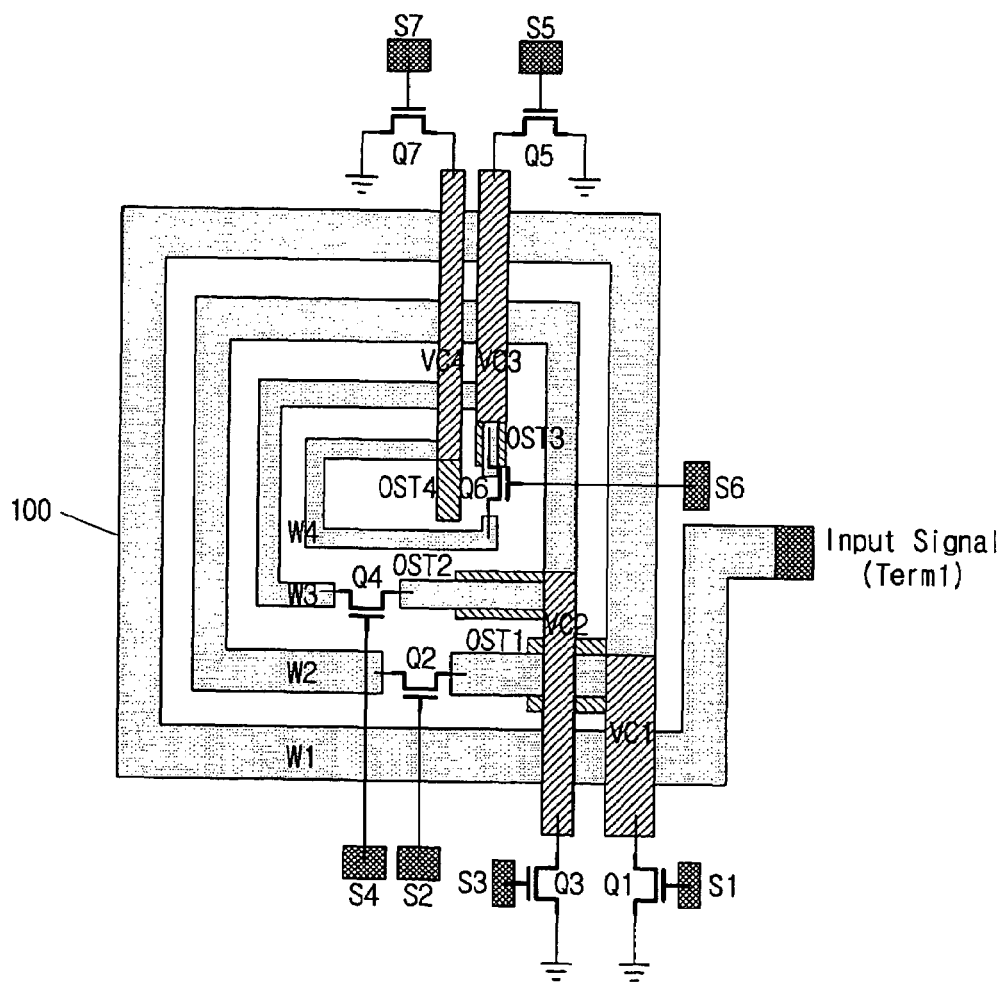
FIG. 2 is a plan view showing a first embodiment of a spiral inductor having a variable inductance, according to the invention.

FIG. 2 is a plan view showing a first embodiment of a spiral inductor having a variable inductance, according to the invention. The spiral inductor of FIG. 2 forms a spiral pattern on a substrate using conductors W1~W4 having different widths from each other. Specifically, the spiral inductor of FIG. 2 comprises a metal line 100 having open-type stubs OST1~OST4 at one side of the spiral pattern; and switching means Q1~Q7 connection-controlled in accordance with selection signals S1~S7 for adjusting an inductance and selectively connecting the conductors W1~W4 of the different widths of the metal line 100.

Figure 3:
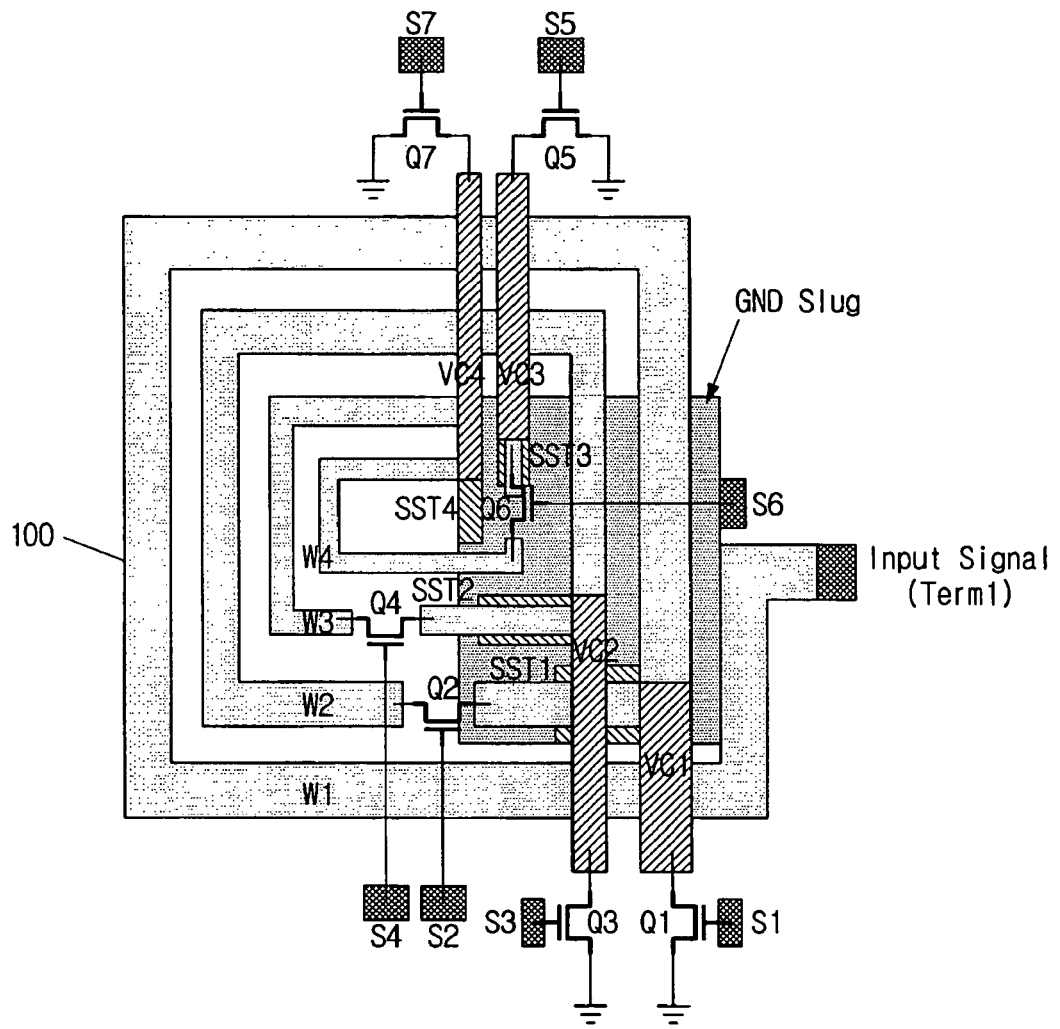
FIG. 3 is a plan view showing a second embodiment of a spiral inductor having a variable inductance, according to the invention.

In addition, according to a second embodiment of the invention, a spiral inductor having a variable inductance and formed on a semiconductor substrate, as shown in FIG. 3, comprises a metal line 100 consisting of conductors W1~W4 having different widths to one another, forming a spiral pattern on the substrate and specifically, having short-type stubs SST1~SST4 at one side of the spiral pattern formed; and switching means Q1~Q7 connection-controlled in accordance with selection signals S1~S7 for adjusting an inductance and selectively connecting the conductors W1~W4 to one another.

Like this, according to the invention, when embodying a spiral inductor in an integrated circuit (IC) of a variety of communication devices using a high frequency band, the metal line having a spiral structure is embodied as conductors having different widths and the open or short-type stubs are formed at one sides of each of the conductors, thereby inducing a parasitic capacitance or parasitic inductance through the stubs. By inducing the parasitic capacitance or parasitic inductance or selectively connecting the conductors having different widths to one another, it is possible to accurately control a whole inductance value of the spiral inductor, depending on use purposes. As a result, it is possible to output the Q-quality of the inductor in a specific frequency band utmost or to embody an inductor to have various inductances using a small area on the substrate, in a high frequency band, thereby increasing the degree of integration in the integrated circuit.

The invention relates to a spiral inductor provided in an integrated circuit of a variety of communication devices using a high frequency band. The spiral inductor of the invention comprises a spiral-shaped metal line having conductors of different widths, stubs connected to one side of each of the conductors in an open or short form and inducing a parasitic capacitance or parasitic inductance, and switching means for selectively connecting the conductors to one another to selectively adjust an area of the metal line in accordance with a width change in the metal line.

Figure 4:
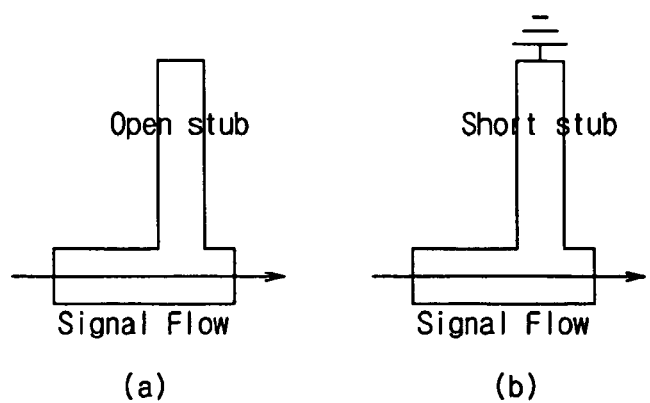
FIG. 4 shows an operating principle of a stub applied to a spiral inductor having a variable inductance, according to an embodiment of the invention.
Figure 5:
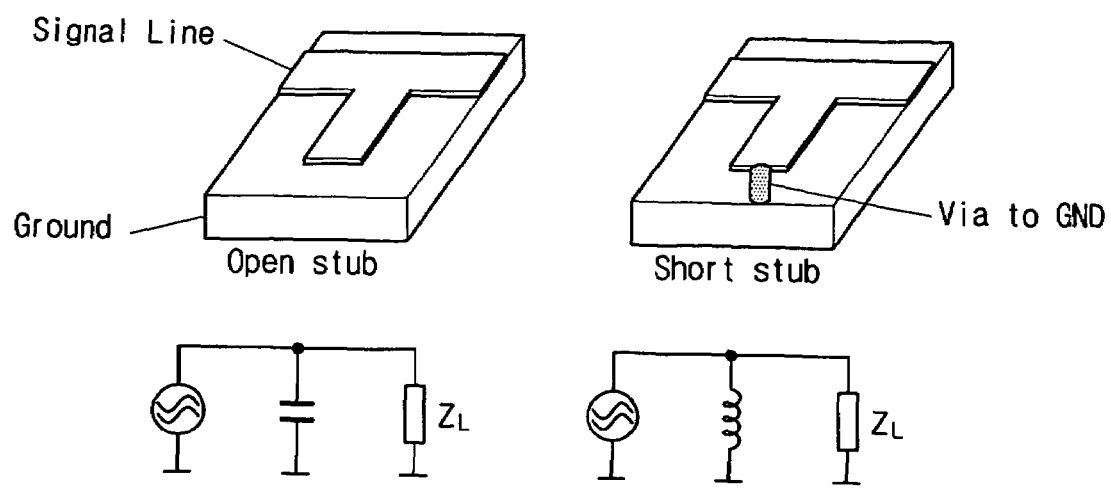
FIG. 5 shows an example of a stub applied to a spiral inductor having a variable inductance and an equivalent circuit thereof, according to an embodiment of the invention.

In general, an inductance of the spiral inductor is affected by a parasitic capacitance or inductance occurring in the metal line or an area of the metal line. In the present invention, as an embodiment of a stub shown in FIGS. 4 and 5, it is such structured in an integrated circuit that the open-type stub serves as a capacitor due to a dielectric between a signal line and a ground and the short-type stub serves as an inductor by connecting the one metal line to the ground in a row in the signal line through the short-type stub. At this time, a control section (not shown) of the integrated circuit carries out a control of selecting an area of the metal line constituting the spiral inductor, thereby selectively adjusting an entire area of the metal line together with the open or short-type stub to vary a whole inductance needed in the integrated circuit.

A length of the stub which is newly connected to the one side of the metal line can be calculated by a following equation 1, because a wavelength of a signal passing to the inductor in air should be converted into a guided wavelength.

$$\frac{\lambda}{\sqrt{\varepsilon_r}} \quad \text{Equation 1}$$

where, $\lambda$: wavelength of a signal in air, and
$\varepsilon_r$: relative permittivity of a conductor constituting a metal line.

For example, when embodying a stub having impedance of 50Ω on a semiconductor substrate by the equation 1, it can be seen that a width thereof is '2.05 mm' and it is connected to the metal line in a length of '$\lambda/2$.'

A variety of stubs can be applied to the invention. Among other things, it is most important to adjust a width and a length of a stub. Depending on uses of an integrated circuit to which the invention is applied, it has only to differently design a width and a length of the stub so as to satisfy impedance needed in the inductor within a specific frequency band.

Figure 6:
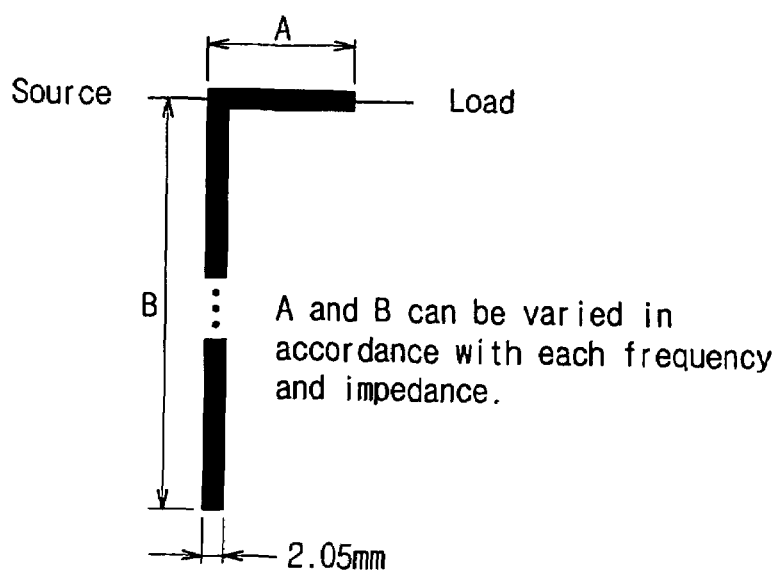
FIG. 6 shows an example adjusting a width and a length of a stub applied to a spiral inductor having a variable inductance, according to an embodiment of the invention.
Figure 7:
FIG. 7 shows an example of a line of a stub applied to a spiral inductor having a variable inductance, according to an embodiment of the invention.

FIG. 6 shows an example of adjusting a width and a length of a stub in an inductor having impedance of 50Ω, wherein a load section (A) and a stub section (B) can be varied depending on frequency bands. FIG. 7 shows an example of a method for forming a line of a stub, wherein a characteristic of an inductor can be varied by forming corners to be different from each other. At this time, the metal line and the stub of the inductor may be connected to each other through a via contact.

In the mean time, as shown in FIG. 2, a spiral inductor having a variable inductance according to a first embodiment of the invention may comprise a metal line 100 and switching means Q1~Q7 when forming the spiral inductor on a semiconductor substrate. The metal line 100 forms a spiral pattern on the substrate using conductors W1~W4 having different widths to one another and has open-type stubs OST1~OST4 at one side of each of the conductors. The switching means Q1~Q7 are connection-controlled in accordance with selection signals S1~S7 for adjusting an inductance outputted from a control section (not shown) in the integrated circuit, thereby selectively connecting the conductors W1~W4 to one another.

With respect to the metal line 100, the conductors W1~W4, which may be made of a same material and have different widths to one another, are respectively arranged in a spiral shape by at least one turn. The switching means Q1~Q7 are positioned at connection parts of the open-type stubs OST1~OST4 and the conductors W1~W4 and between the respective conductors W1~W4. The switching means Q1~Q7 may be embodied with a Metal Oxide Semiconductor transistor (MOS transistor) having a rapid operating speed and low power consumption. To the connection parts of the open-type stubs OST1~OST4 and the conductors W1~W4 may be connected switching means S1, S3, S5, S7 through the via contacts VC1~VC4.

Figure 8:
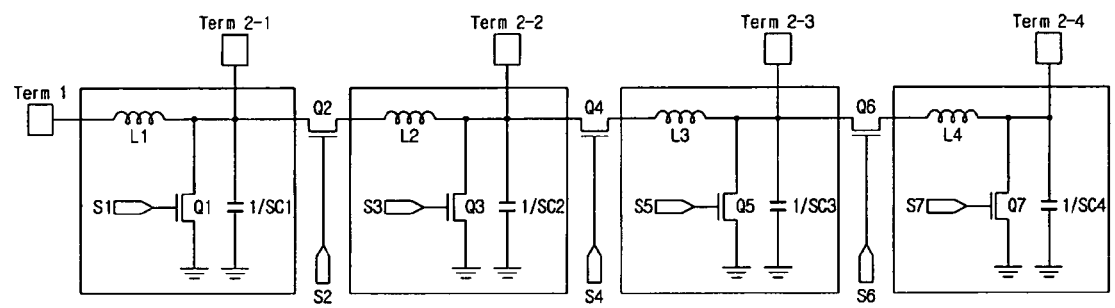
FIG. 8 is a circuit diagram showing an equivalent circuit of the first embodiment in FIG. 2.

An equivalent circuit of the first embodiment of the invention is shown in FIG. 8. The conductors W1~W4 having different widths in FIG. 2 correspond to each of inductors L1~L4. In addition, the open-type stubs OST1~OST4 connected to the metal line 100 in FIG. 2 correspond to each of parasitic capacitors (1/SC1)~(1/SC4). In FIG. 8, 'Term1,' 'Term 2-1,' 'Term 2-2,' 'Term 2-3' and 'Term 2-4' correspond to ports to be connected to the integrated circuit. With regard to a whole inductance of the spiral inductor, it is provided a cascade increasing type inductor wherein the impedance is increased depending on the selection of the ports ('Term 2-1' to 'Term 2-4') while using the port (Term 1) commonly.

For example, an impedance of an inductor connected to 'Term 1~Term 2-1' is 'L1//(1/SC1)' and an impedance of an inductor connected to 'Term 1~Term 2-2' is '(L1//(1/SC1))+ (L2//(1/SC2)).' Likewise, in case of 'Term 1~Term 2-3,' the impedance is '(L1//(1/SC1))+(L2//(1/SC2))+(L3//(1/SC3))' and in case of 'Term 1~Term 2-4,' the impedance is '(L1//(1/SC1))+(L2//(1/SC2))+(L3//(1/SC3))+(L4//(1/SC4)).'

The one switching means Q2, Q4, Q6 switch the conductors W1~W4 to one another, and the other switching means Q1, Q3, Q5 control driving of the respective inductors L1~L4, which is caused by the conductors W1~W4.

At this time, as described above, the open-type stubs OST1~OST4 are arranged so that the parasitic capacitance is induced by the dielectric of the semiconductor substrate between the metal line 100 and the ground, and the widths and lengths of the open-type stubs OST1~OST4 are designed depending on the impedance required for the spiral inductor, so that it is possible to embody the inductor in various uses, correspondingly to the frequency band.

In the mean time, a second embodiment of the spiral inductor having a variable inductance according to the invention comprises a metal line 100 and switching means Q1~Q7, as shown in FIG. 3. The metal line 100 consists of conductors W1~W4 having different widths to form a spiral pattern on a substrate and short-type stubs SST1~SST4 are provided at one side of the spiral pattern formed. The switching means Q1~Q7 are connection-controlled in accordance with selection signals S1~S7 for adjusting an inductance outputted from a control section (not shown) in an integrated circuit and selectively connect the conductors W1~W4 to one another.

In the second embodiment of the invention, the metal line 100 having a similar structure as the first embodiment is provided and the function of the switching means Q1~Q7 is same. However, the second embodiment is different from the first embodiment in that the short-type stubs SST1~SST4 connected to the metal line 100 serving as an inductor are electrically connected to a GND slug through a via contact, instead of the open-type stubs OST1~OST4, and the short-type stubs SST1~SST4 themselves serve as separate inductors.

Figure 9:
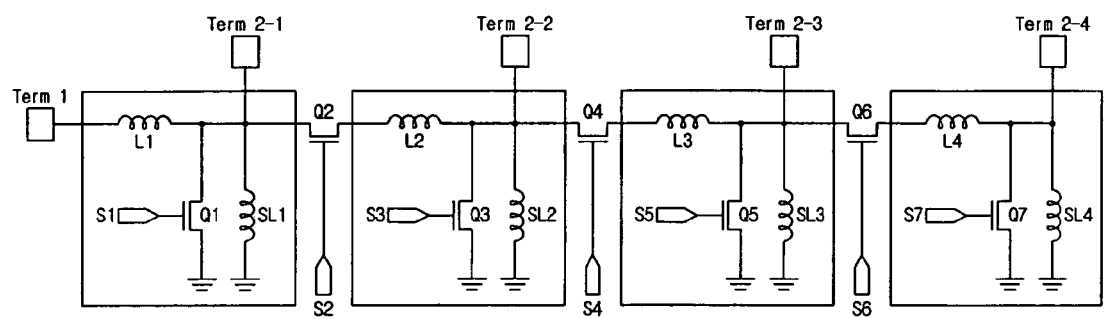
FIG. 9 is a circuit diagram showing an equivalent circuit of the second embodiment in FIG. 3.

These constitutions can be also seen from an equivalent circuit in FIG. 9. The short-type stubs SST1~SST4 connected to the metal line 100 in FIG. 3 correspond to inductors SL1~SL4 in FIG. 9, respectively. In FIG. 9, 'Term 1,' 'Term 2-1,' 'Term 2-2,' 'Term 2-3' and 'Term 2-4' correspond to ports connected to the integrated circuit, respectively. The spiral inductor in FIG. 9 has a structure constituting a cascade increasing type inductor wherein the impedance is increased from 'Term 2-1' to 'Term 2-4' while using 'Term 1' commonly.

In addition, in the embodiment of FIG. 9, an impedance of an inductor connected to 'Term 1~Term 2-1' is 'L1//SL1' and an impedance of an inductor connected to 'Term 1~Term 2-2' is '(L1//SL1)+(L2//SL2).' Likewise, in case of 'Term 1~Term 2-3,' the impedance is '(L1//SL1)+(L2//SL2)+(L3//SL3),' and in case of 'Term 1~Term 2-4,' the impedance is '(L1//SL1)+(L2//SL2)+(L3//SL3)+(L4//SL4).' Like this, when the widths and lengths of the short-type stubs SST1~SST4 are designed depending on the impedance required for the spiral inductor, it is possible to embody the inductor in various uses, correspondingly to the frequency band.

In the first and second embodiments, it has been described the open or short-type stubs connected to one side of each of conductors of the metal line 100. However, it is also possible to connect both the open-type and short-type stubs, thereby forming an inductor, depending on the impedance of the inductor needed in the integrated circuit.

In the mean time, in the first and second embodiments, it has been described the inductor having open or short-type spiral structure embodied in one layer. However, as described below, it is also possible to embody the inductor stacked on two or more layers, as the integrated circuit is formed to have a multi-layer structure.

Figure 10:
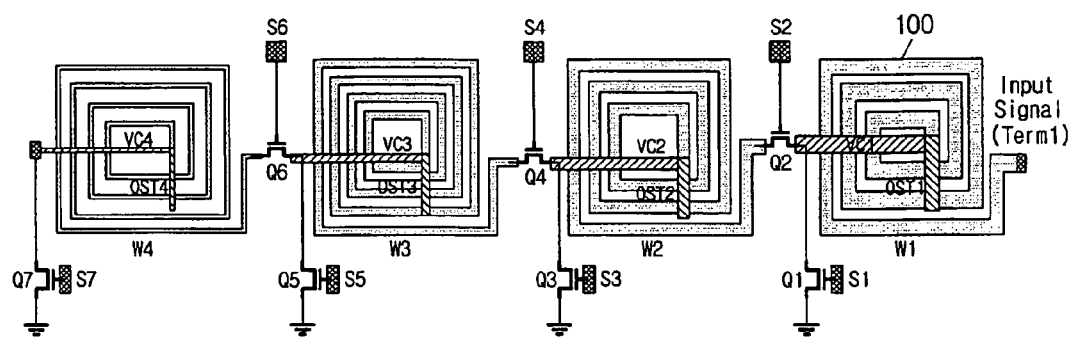
FIG. 10 is a plan view showing a third embodiment of a spiral inductor having a variable inductance, according to the invention.
Figure 11:
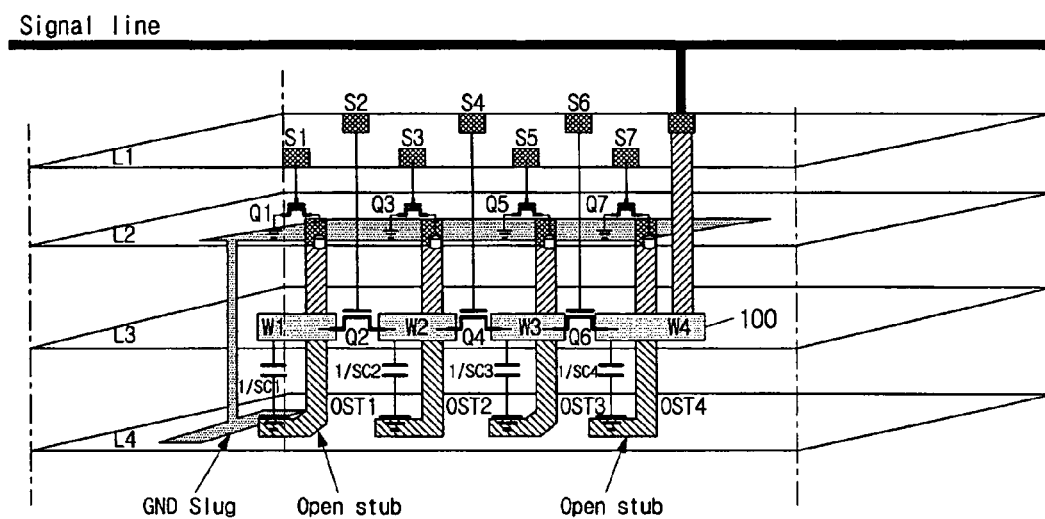
FIG. 11 shows an example embodied in accordance with FIG. 10.

According to a third embodiment of the invention, the spiral inductor having a variable inductance may be integrated on a semiconductor substrate, as shown in FIGS. 10 and 11. The spiral inductor comprises a metal line 100 and switching means Q1~Q7, and is arranged to two or more layers. The spiral inductor has a structure consisting of the first layer to the fourth layer (L1~L4). The first layer L1 may have ports receiving selection signals S1~S7 for adjusting an inductance outputted from a control section (not shown) in the integrated circuit. The second layer L2 may have switching means Q1~Q7 connection-controlled by the selection signals S1~S7 inputted through the first layer L1. The third layer L3 may have conductors W1~W4, wherein each of the conductors W1~W4 may have different widths to one another and be formed into a spiral pattern having one or more turns on the substrate, and open-type stubs OST1~OST4 formed at one side of each of the conductors W1~W4. The fourth layer L4 is for applying ground power. In FIG. 11, parasitic capacitors (1/SC1)~(1/SC4), which are induced by the open-type stubs OST1~OST4, are shown together with the open-type stubs OST1~OST4.

Figure 12:
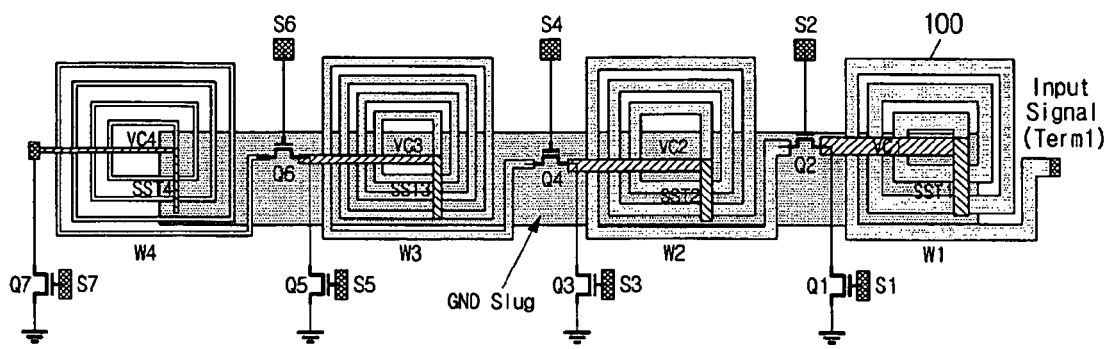
FIG. 12 is a plan view showing a fourth embodiment of a spiral inductor having a variable inductance, according to the invention.
Figure 13:
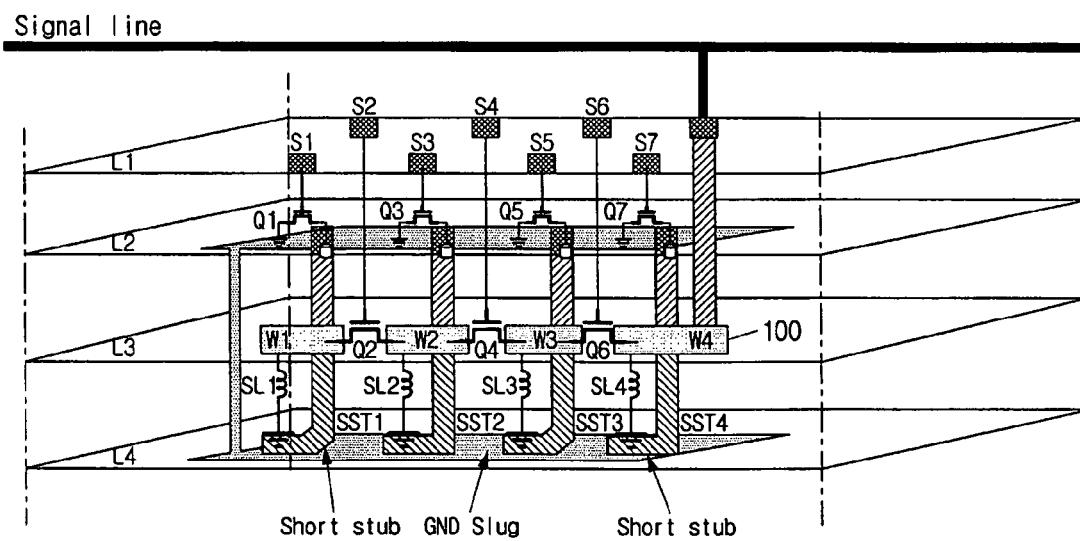
FIG. 13 shows an example embodied in accordance with FIG. 12.

In addition, according to a fourth embodiment of the invention, the spiral inductor having a variable inductance may be integrated on a semiconductor substrate, as shown in FIGS. 12 and 13. The spiral inductor is arranged to two or more layers and has a structure consisting of the first layer to the fourth layer (L1~L4). The first layer L1 may have ports receiving selection signals S1~S7 for adjusting an inductance outputted from a control section (not shown) in the integrated circuit. The second layer L2 may have switching means Q1~Q7 connection-controlled by the selection signals S1~S7 inputted through the first layer L1 The third layer L3 may have conductors W1~W4, wherein each of the conductors W1~W4 may have different widths to one another and be formed into a spiral pattern having one or more turns on the substrate and short-type stubs SST1~SST4 formed at one side of each of the conductors W1~W4. The fourth layer L4 is for applying ground power. In FIG. 13, inductors SL1~SL4, which are induced by the short-type stubs SST1~SST4, are shown together with the short-type stubs SST1~SST4.

In the third and fourth embodiments, the respective layers L1~L4 may be differently arranged depending on environments of the integrated circuit. Preferably, when the metal line 100 is formed at the third layer L3, the one switching means Q2, Q4, Q6 are formed at the same layer L3 as the metal line 100, and the open and short-type stubs OST1~OST4, SST1~SST4 are arranged so that they are formed from the layer L3, at which the metal line 100 is formed, to the lower layer L4, so as to form a cascade arrangement in adjusting a whole inductance of the inductor.

The third and fourth embodiments are similar to the first and second embodiments, respectively, with respect to the functions and structures thereof. The third and fourth embodiments can increase the impedance of the inductor using the metal line 100 having the larger area, as compared to the first and second embodiments. To this end, in the third and fourth embodiments, the inductor is integrated at two or more layers.

In the third and fourth embodiments, it has been described the open or short-type stubs connected to one side of the metal line 100 constituting the inductor. However, it is also possible to connect both the open-type and short-type stubs, thereby forming an inductor having a multi-layer structure, depending on the impedance of the inductor required in the integrated circuit.

As described above, according to the invention, when embodying a spiral inductor in an integrated circuit (IC) of a variety of communication devices using a high frequency band, the metal line having a spiral structure is embodied as conductors having different widths and the open or short-type stubs may be formed at one sides of each of the conductors, thereby inducing a parasitic capacitance or parasitic inductance through switching means. Based on the inducement of the parasitic capacitance or inductance and selectively connection of the conductors to one another through switching means, it is possible to accurately control a whole inductance value of the spiral inductor, depending on use purposes. As a result, it is also possible to output the Q-quality of the inductor in a specific frequency band utmost or to embody an inductor to have various inductances using a small area on the substrate, in a high frequency band, thereby increasing the degree of integration in the integrated circuit.

While the invention has been shown and described with reference to certain preferred embodiments thereof, it will be understood by those skilled in the art that various changes in form and details may be made thereto without departing from the spirit and scope of the invention as defined by the appended claims.

What is claimed is:

1. A spiral inductor formed on a semiconductor, the spiral inductor comprising:
    a first conductor and a second conductor arranged in a spiral pattern in a plane form and having different widths from each other;
    a stub connected to one side of the first conductor; and
    a switch connection-controlled in accordance with a selection signal, the switch to connect the first conductor to the second conductor if the switch is in an on-position,
    wherein if the switch is in an off-position, the first conductor and the second conductor are disconnected from each other, and
    wherein the stub is an open-type stub arranged to induce a parasitic capacitance by a dielectric between the first conductor and a ground.

2. The spiral inductor according to claim 1, wherein the switch comprises a Metal Oxide Semiconductor transistor.

3. An integrated circuit comprising the spiral inductor according to claim 1.

4. A wireless terminal comprising the spiral inductor according to claim 1.

5. The spiral inductor according to claim 1, further comprising:
    a via contact connected to the first conductor; and
    a switching device arranged between the via contact and a ground,
    wherein the via contact is connected to ground if the switching device is in an on-position.

6. A spiral inductor formed on a semiconductor, the spiral inductor comprising:
    a first conductor and a second conductor arranged in a spiral pattern in a plane form and having different widths from each other;
    a stub connected to one side of the first conductor; and
    a switch connection-controlled in accordance with a selection signal, the switch to connect the first conductor to the second conductor if the switch is in an on-position,
    wherein if the switch is in an off-position, the first conductor and the second conductor are disconnected from each other, and
    wherein the stub is a short-type stub arranged to connect the first conductor to a ground through a via contact.

7. The spiral inductor according to claim 1, wherein the switch comprises a Metal Oxide Semiconductor transistor.

8. An integrated circuit comprising the spiral inductor according to claim 6.

9. A wireless terminal comprising the spiral inductor according to claim 6.

10. The spiral inductor according to claim 6, further comprising:
    a via contact connected to the first conductor; and
    a switching device arranged between the via contact and a ground,
    wherein the via contact is connected to ground if the switching device is in an on-position.

* * * * *